(12) United States Patent
Bal et al.

(10) Patent No.: US 8,645,445 B2
(45) Date of Patent: Feb. 4, 2014

(54) FILTER BLOCK FOR COMPENSATING DROOP IN A FREQUENCY RESPONSE OF A SIGNAL

(75) Inventors: Ankur Bal, Noida (IN); Anupam Jain, Delhi (IN)

(73) Assignee: ST-Ericsson SA, Plan-les-Ouates (CH)

( * ) Notice: Subject to any disclaimer, the term of this patent is extended or adjusted under 35 U.S.C. 154(b) by 1063 days.

(21) Appl. No.: 12/614,004

(22) Filed: Nov. 6, 2009

(65) Prior Publication Data

US 2010/0121897 A1 May 13, 2010

(30) Foreign Application Priority Data

Nov. 6, 2008 (IN) .............................. 2526/DEL/2008

(51) Int. Cl.
*G06F 17/17* (2006.01)
(52) U.S. Cl.
USPC .......................................... 708/313; 708/304
(58) Field of Classification Search
USPC ................................................... 708/304, 313
See application file for complete search history.

(56) References Cited

U.S. PATENT DOCUMENTS

| | | | |
|---|---|---|---|
| 6,282,184 B1 * | 8/2001 | Lehman et al. | 370/342 |
| 6,813,484 B1 * | 11/2004 | Tolson | 455/307 |
| 8,386,971 B2 * | 2/2013 | Mansour | 716/100 |
| 2010/0235420 A1 * | 9/2010 | Willson, Jr. | 708/313 |

FOREIGN PATENT DOCUMENTS

EP 1612935 * 1/2006 ............. H03H 17/02

* cited by examiner

*Primary Examiner* — Tammara Peyton
(74) *Attorney, Agent, or Firm* — Coats & Bennett, P.L.L.C.

(57) ABSTRACT

The invention may provide a method and filter block for compensating droop in a frequency response of a signal. The filter block may include a decimator, which decimates a high frequency input signal to a set frequency output signal. The set frequency can be, for example, the Nyquist frequency for the input signal. Further, the filter block may include a droop compensator that compensates the droop in the frequency response of the output signal from the decimator. The droop compensator may be made using recursive filters, as opposed to large tap FIR filters, which may result in less memory consumption and decreased power consumption.

24 Claims, 11 Drawing Sheets

FILTER BLOCK FOR COMPENSATING DROOP IN A FREQUENCY RESPONSE OF A SIGNAL

FIELD OF THE INVENTION

The present invention relates, in general, to digital signal processing and more specifically to a filter block for compensating pass band droop in a signal.

BACKGROUND OF THE INVENTION

Recent times have seen an increase in the use of data converters, especially those used in audio signal processing. Signal processing is typically done by digital filters, such as, Finite Impulse Response (FIR) filters and Infinite Impulse Response (IIR) filters. The main objective of signal processing is to convert an analog signal to a digital signal and then to convert the digital signal back to the analog signal. An analog signal is converted to a digital signal because sometimes the signal cannot be readily transmitted in the analog form. Therefore, to ensure effective transmission of the analog signal from place to another, the analog signal is first converted to a digital form and then transmitted. Thereafter, the digital signal is converted back to the analog form.

The two basic signal processing functions are decimation and interpolation. Broadly, decimation can be termed as a process of down converting the sampling frequency of a signal so that a lesser amount of memory is used to transmit the signal in digital form. Also, decimating a signal to an appropriate frequency, like the Nyquist frequency, ensures that when the signal is converted back to analog form, the resultant analog signal does not deviate greatly from the original analog signal. Interpolation, on the other hand, is the process of "filing the gaps" in the generated analog signal to get a signal similar to the original analog signal.

A typical decimator or a digital down converter for handling a large rate change uses a high order decimator filter chain. Such a conventional high order decimator filter chain may comprise a large number of multipliers and long filters. An efficient approach for reducing the number of multipliers in implementing such a high order decimator chain can be achieved by replacing the high order decimation chain with a cascaded integrator comb (CIC) filter.

CIC filters are based on adders and subtractors, as opposed to multipliers in conventional decimators. CIC filters are built using integrator and comb filter pairs and are capable of multi-rate processing. CIC filters are specifically used in a variety of applications such as hardware quadrature modulation and demodulation in modern wireless systems and delta-sigma analog-to-digital and digital-to-analog converters. In effect, CIC filters act as narrowband low pass filters and are economical in comparison to conventional FIR filters.

In spite of the increased use of CIC filters, they may have certain limitations. One of the limitations is the soft frequency roll off, as compared to the sharp frequency roll off in the case of a low pass FIR filter. Such a soft frequency roll off results in a wide transition region and a non-flat pass band. Also, for a more faithful and acceptable imaging or alias rejection, the order of the CIC filter has to be increased. Increasing the order of the CIC filter results in increased droop in the pass band. Typically, this droop in the pass band can be countered by using a compensating non-recursive FIR filter cascaded with the CIC filter. However, the compensating non-recursive FIR filter works at a low sampling rate and introduces a constant group delay in the output signal of the complete filter sequence. Further, the tap length of the compensating non-recursive FIR filter is dependent upon the stop band attenuation used before decimation and the order of the CIC filter.

The tap length of the compensating non-recursive FIR filter is dependent on the order of the CIC filter and the pass band bandwidth. In the case where the order of the CIC filter or the pass band bandwidth is increased, the tap length of the compensating non-recursive FIR filter may also be increased to achieve appropriate compensation against the droop in the pass band caused by the CIC filter. For example, a fourth order CIC filter would use a 60-70 tap FIR filter for achieving a decent in band signal-to-noise ratio (SNR).

A large tap length FIR filter is difficult to implement and causes a high area penalty on the ever-decreasing silicon area available to designers. Further, the large tap length FIR filter operates at a frequency greater than the Nyquist rate, thereby increasing the overall power consumption. Also, the increasing number of coefficients in the large tap length filter may increase the filter complexity. This effectively increases the number of memory elements and multipliers, the original problem that the CIC filter solved by replacing the high order decimation or interpolation chain.

In light of the above, there is a need for a method and system for addressing the use of the large tap FIR filters to compensate for the droop in the frequency response of a signal. The system should not use large memory elements and should not increase the overall power consumption. Also, the method and system should not use a large area of the available silicon area.

SUMMARY OF THE INVENTION

Various embodiments of the present invention provide a method and a filter block for compensating for pass band droop in a signal. The droop compensation is achieved by using low order recursive filters, as opposed to high order FIR filters, which were used in the prior art. This ensures that the filter block does not use significant amounts of memory and also does not consume increased power. Also, since low order recursive filters are used, the filter block does not use greater resources in the available silicon area. A phase error correction is also provided for the signal compensation for pass band droop to achieve a linear phase and flat in-band characteristics. The phase error correction is achieved by the use of an all pass filter.

In accordance with one embodiment of the invention, a filter block is provided for compensating pass band droop in a signal. The filter block may include a decimator for decimating a high frequency input signal to a predetermined frequency output signal. The predetermined frequency can be, for example, the Nyquist frequency of the high frequency input signal. Further, the filter block may include a droop compensator for compensating pass band droop in the output signal from the decimator.

In accordance with another embodiment of the invention, a method for compensating pass band droop in a signal is provided. The method may include receiving a high frequency input signal. Further, the method may include decimating the received high frequency signal to a predetermined frequency output signal. The predetermined frequency can be, for example, the Nyquist frequency of the high frequency input signal. Furthermore, the method may include compensating a pass band droop in the decimated predetermined frequency output signal.

BRIEF DESCRIPTION OF THE DRAWINGS

The accompanying figures, where like reference numerals refer to identical or functionally similar elements throughout the separate views, and which, together with the detailed description below, are incorporated in and form of the specification, serve to further illustrate various embodiments and explain various principles and advantages, all in accordance with the present invention.

DETAILED DESCRIPTION OF THE PREFERRED EMBODIMENTS

Figure 1:
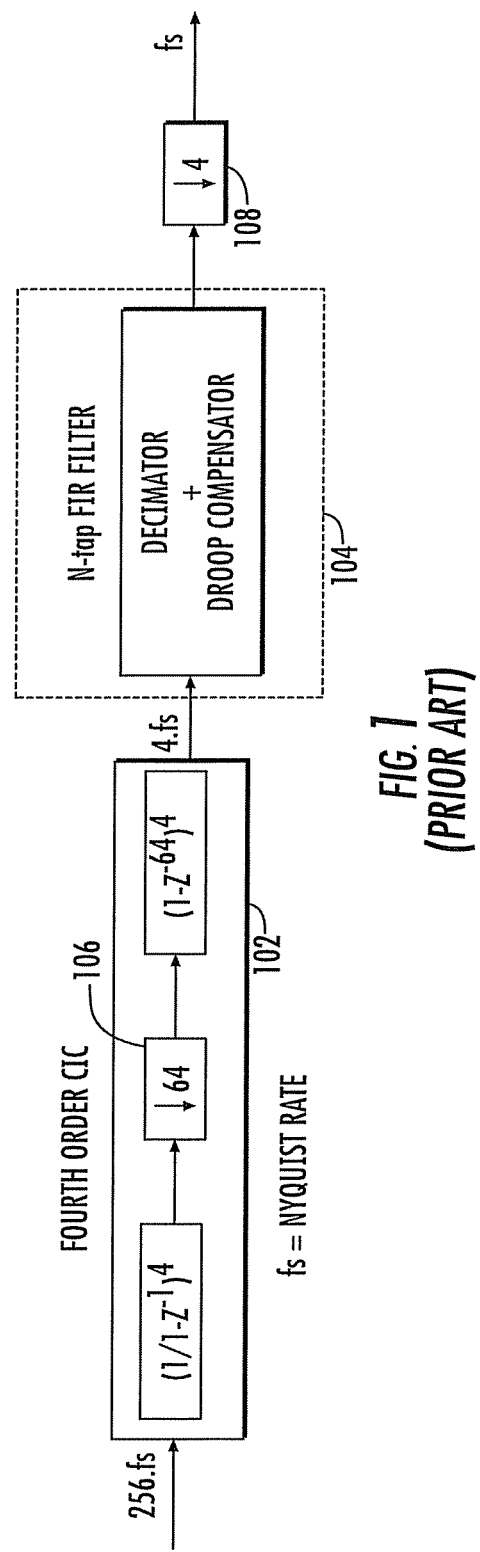
FIG. 1 illustrates a block diagram of a prior art CIC decimator system with a FIR filter based droop compensator.

Before describing in detail the particular method and system in accordance with various embodiments of the present invention, it should be observed that the present invention resides primarily in combinations of method steps related to using a filter block for compensating pass band droop in a signal. Accordingly, the system components and method steps have been, represented, where appropriate, by conventional symbols in the drawings, showing only those specific details that are pertinent for an understanding of the present invention, so as not to obscure. The disclosure with detail that may be readily apparent to those with ordinary skill in the art, having the benefit of the description herein.

FIG. 1 illustrates a block diagram of a prior art Cascaded Integrator Comb (CIC) decimator system 102 cascaded with a Finite Impulse Response (FIR) filter based droop compensator 104. The CIC decimator system 102 decimates the high frequency input signal to a first frequency output signal. As an example, the CIC decimator system 102 is assumed to be a fourth order decimator system, with the transfer function of $$\left[\frac{1-z^{-64}}{1-z^{-1}}\right]^{\wedge}4,$$

the high frequency input signal is assumed to have a frequency of 256*fs, where fs is the Nyquist frequency, and the first frequency output signal has a frequency of 4*fs. Those ordinarily skilled in the art may appreciate that fs is the Nyquist frequency for the input signal 256*fs and numerically, the value of fs can be assumed to be 44.1 KHz. Since the audible audio frequency lies between 20 Hz and 20 KHz, therefore the value of Nyquist frequency has to be at least 2*20 KHz, i.e. 40 KHz. For all practical purposes, the value of fs is assumed to be 44.1 KHz.

After the CIC decimator system 102 decimates the high frequency input signal, 256*fs, to a first frequency output signal, 4*fs, using a first down converter 106, the FIR filter based droop compensator 104 compensates the pass band droop in the output signal, which is introduced by the CIC decimator system 102. For a fourth order CIC decimator system 102, the FIR filter based droop compensator is an N-tap FIR filter, which is usually a 60 or 70-tap FIR filter. The N-tap filter is connected to a second down converter 108, which down converts the first frequency output signal, 4*fs, to the Nyquist frequency signal, fs.

Figure 2:
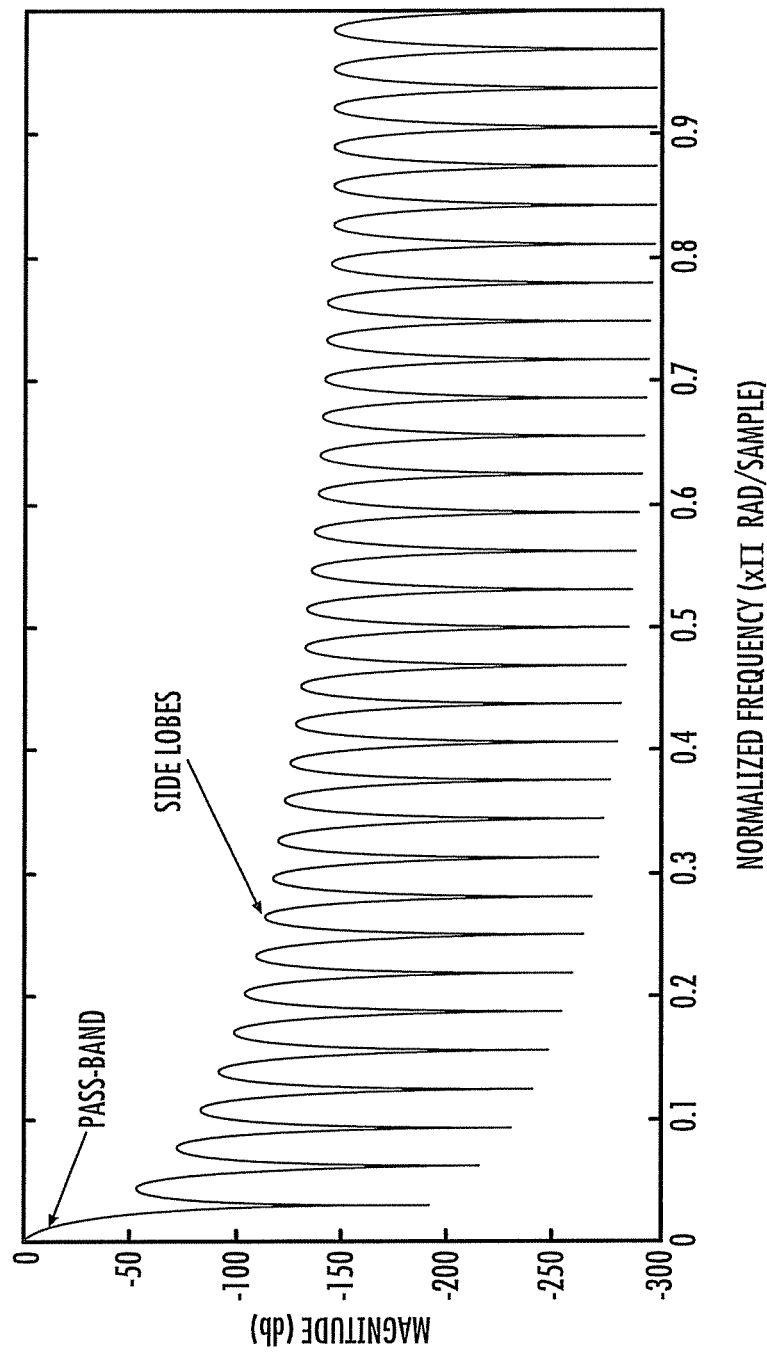
FIG. 2 illustrates a diagram of a frequency response from the CIC decimator system of FIG. 1 before decimation.

FIG. 2 illustrates a diagram of a frequency response from the CIC decimator system 102. If the normalized frequency corresponding to "1" on the diagram is assumed to 128 fs, the first lobe can be assumed to at a frequency of 4*fs. The pass band, as shown in FIG. 2, may correspond to a frequency of 2*fs. The droop in the pass band, i.e. 2*fs, is subsequently compensated by the FIR filter based droop compensator 104. The side lobes are attenuated, as they lie beyond the 2*fs frequency band.

Figure 3:
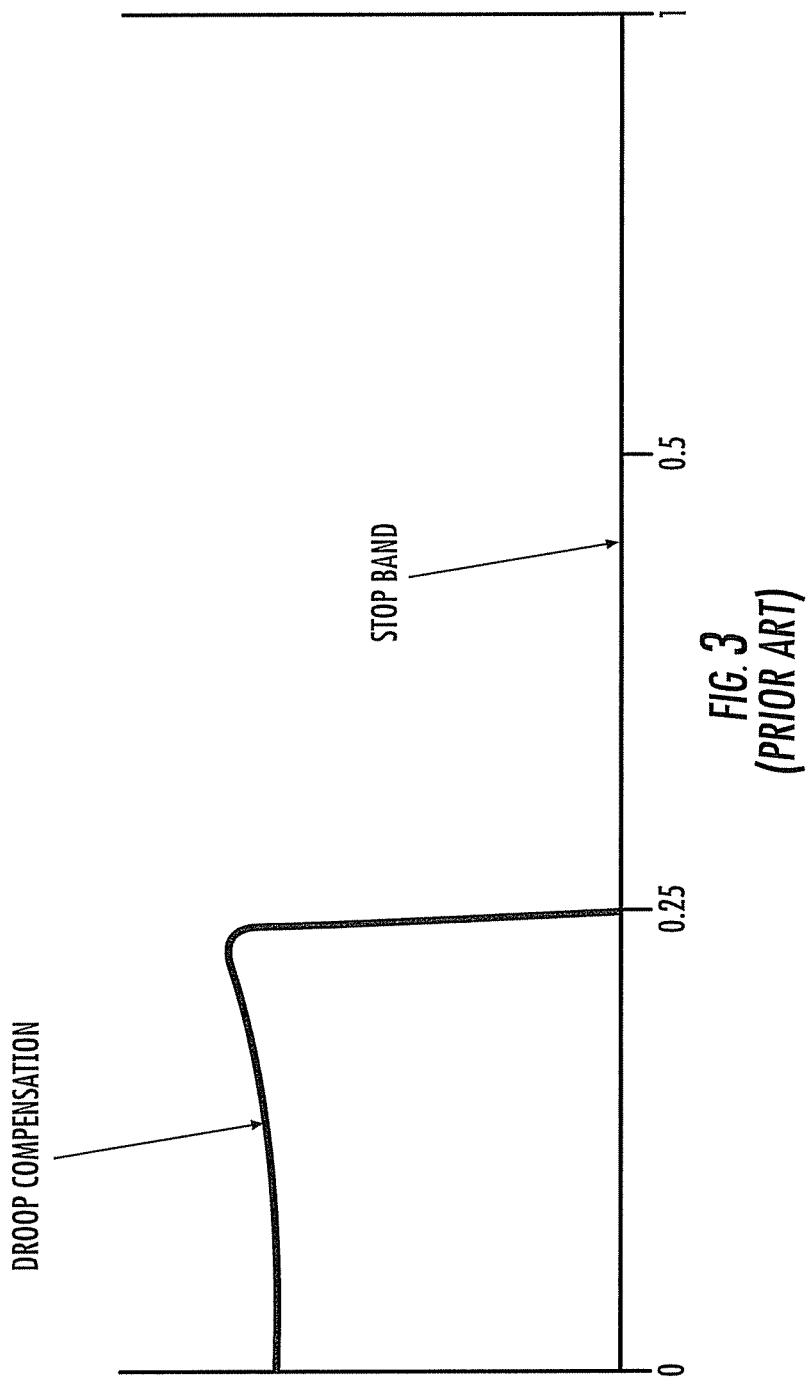
FIG. 3 illustrates a diagram of droop compensation by the FIR filter based droop compensator in FIG. 1.

FIG. 3 illustrates a diagram of droop compensation by the FIR filter based droop compensator. The frequency corresponding to "1" in the diagram is the frequency 2*fs, i.e. 2*44.1 KHz. Therefore, the frequency corresponding to "0.25" in the diagram is the frequency fs/2, i.e. 22.05 KHz. As mentioned already, the audible audio frequency range is 20 Hz to 20 KHz, therefore all the frequency signals beyond fs/2 (~20 KHz) correspond to the stop band. These frequency signals are attenuated and only the frequency signals that correspond to fs/2 frequency are compensated for droop, as shown in FIG. 3.

Figure 4:
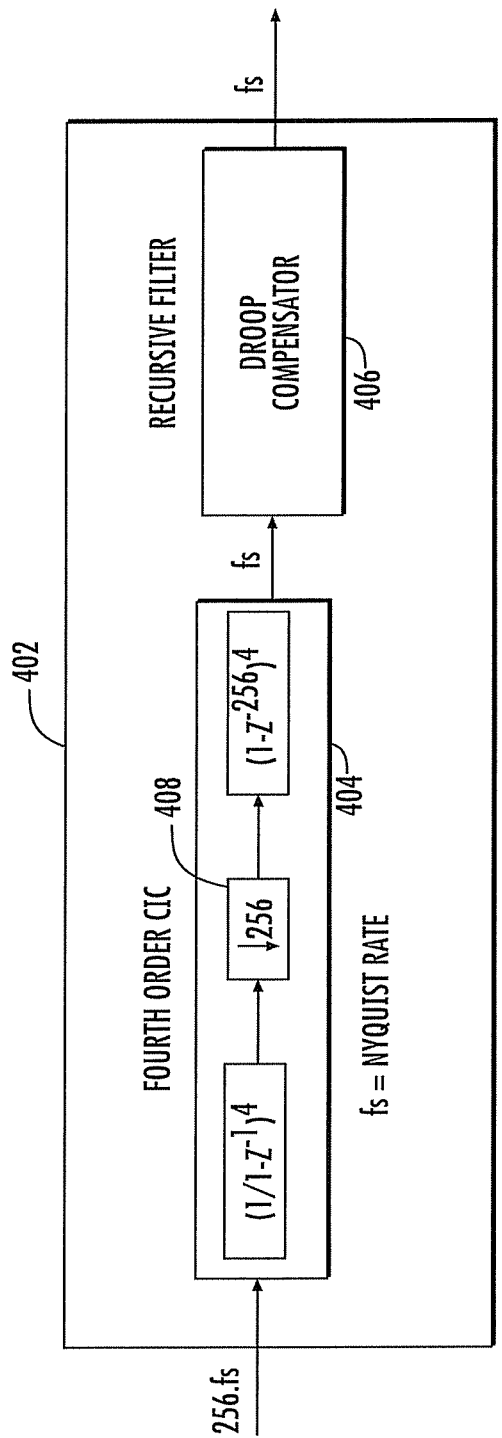
FIG. 4 illustrates an exemplary block diagram of a filter block, in accordance with an embodiment of the present invention.

FIG. 4 illustrates an exemplary block diagram of a filter block 402, in accordance with an embodiment of the present invention. The filter block 402 includes a decimator 404 and a droop compensator 406. In accordance with one embodiment of the invention, the decimator 404 is a fourth order CIC filter, which decimates the high frequency input signal, 256*fs, to an output signal, fs, in a single step. As an example, the transfer function for such a CIC filter is $$\left[\frac{1-z^{-256}}{1-z^{-1}}\right]^{\wedge}4.$$

A single stage down converter 408 down converts the high frequency input signal, 256*fs to fs.

As mentioned in conjunction with FIG. 2, the output signal from a CIC filter has a pass band droop which needs to be compensated. To this end, the droop compensator 406 is cascaded with the decimator 404, which compensates the pass band droop in the signal output from the decimator 404. In accordance with one embodiment of the present invention, the droop compensator 406 is made using low order recursive filters, which have inverse characteristics of the droop.

Those ordinarily skilled in the art may appreciate that the droop compensator 406 can also work with any other system that introduces a pass band droop in a signal. The decimator 404 is used as an example and can be substituted with any other system that introduces a droop in a frequency response of a signal.

Typically, the signal output from the droop compensator 406 has a phase error, which needs to be corrected. The filter system for correcting the phase error in the signal output from the droop compensator 406 has been explained in conjunction with FIG. 5.

Figure 5:
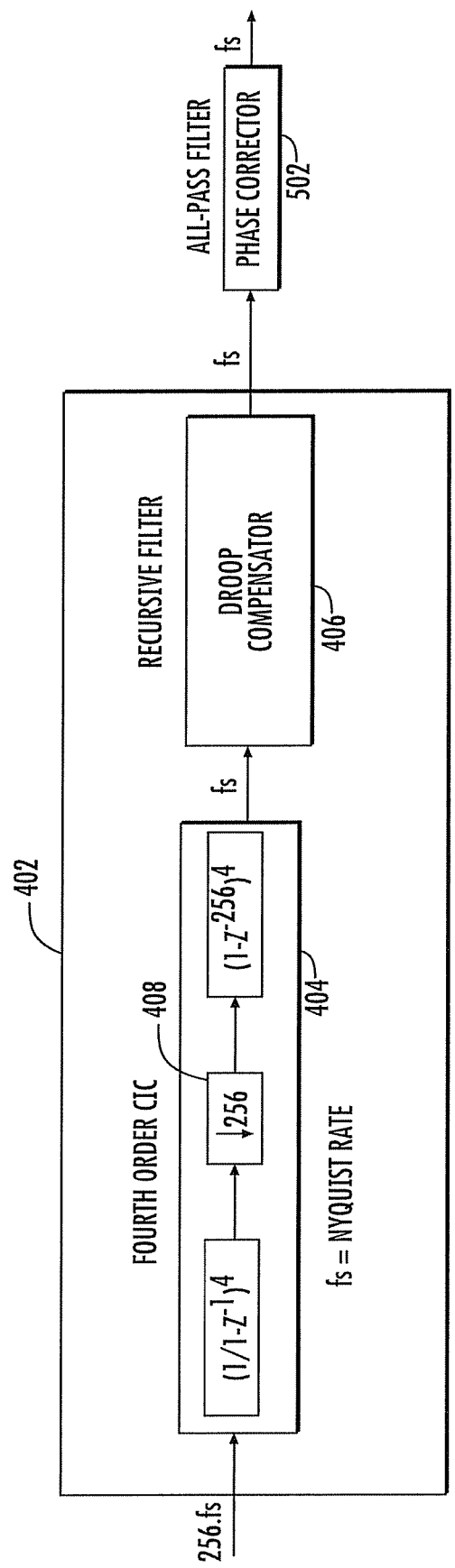
FIG. 5 illustrates an exemplary block diagram of a phase corrector cascaded with the filter block, in accordance with an embodiment of the present invention.

FIG. 5 illustrates an exemplary block diagram of a phase corrector 502 cascaded with the filter block 402, in accordance with an embodiment of the present invention. The functioning of the filter block 402 has already been explained in conjunction with FIG. 4.

The output signal from the filter block 402 has a phase error, which needs to be corrected. Typically, to correct the phase error in the output signal, an all pass filter is first selected so that the two edge points in the frequency response of the output signal come at the same level. An all pass filter is a recursive filter that has unity magnitude response across all frequencies. The phase correction can be controlled by the coefficients of the recursive filters.

After an appropriate all pass filter is selected for the two edge points, one or more all pass filters are further selected that cause the middle point in the frequency response to come at the same level as that of the edge points. Those ordinarily skilled in the art may appreciate that more all pass filters can be added to make even more points on the frequency response of the output signal to come at the level of the edge points.

As explained, to rectify the phase error in the output signal from the filter block 402, the phase corrector 502 is cascaded with the filter block 402. There can be more than one all pass filter in the phase corrector 502, based on the extent of the phase correction used.

Figure 6:
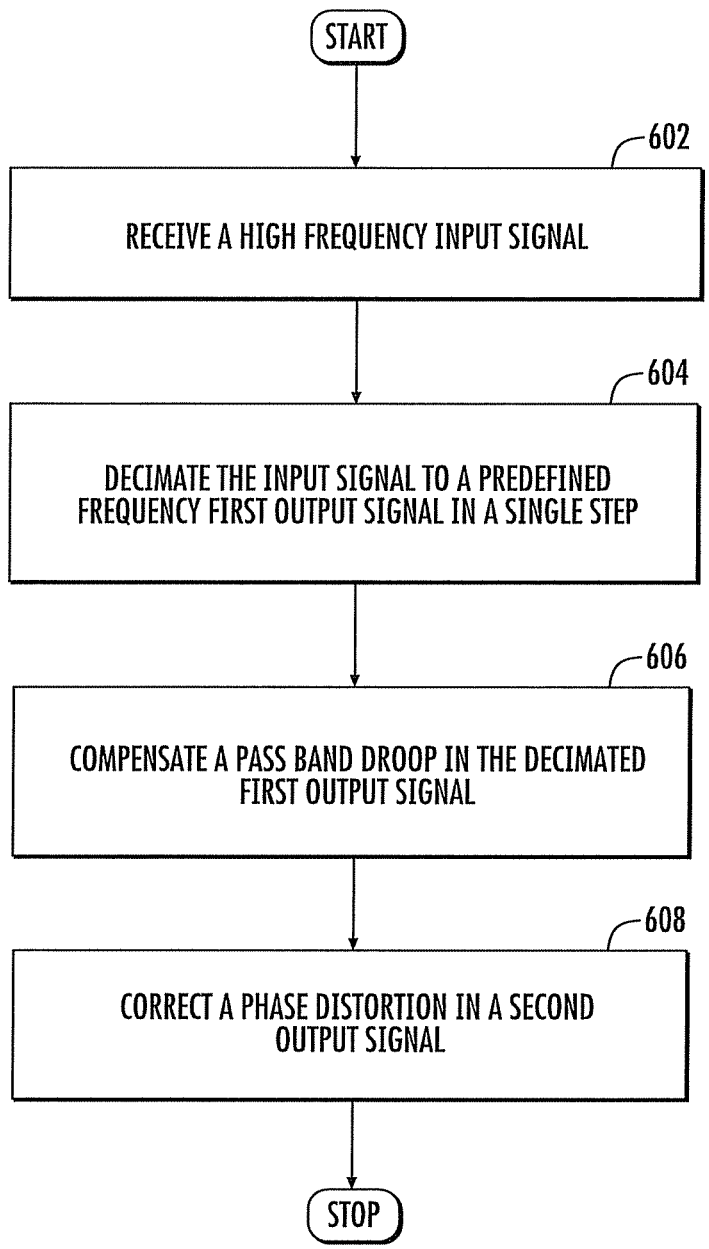
FIG. 6 illustrates a flow diagram for a method for compensating pass band droop in a signal, in accordance with an embodiment of the present invention.

FIG. 6 illustrates a flow diagram for a method for compensating pass band droop in a signal, in accordance with an embodiment of the present invention. At step 602, a high frequency input signal is received. As an example, the high frequency input signal can have a frequency of 256*fs, where fs is the Nyquist frequency of the input signal.

At step 604, the received high frequency input signal is decimated to a Nyquist frequency output signal. The input signal is decimated to the Nyquist frequency output signal in a single step. In other words, if the input signal has a frequency of 256*fs, the input signal is passed through a down converter, which down converts the sampling frequency from 256*fs to fs in a single step.

At step 606, a pass band droop in the Nyquist frequency output signal is compensated. As explained in conjunction with FIGS. 4 and 5, the signal output from the decimator 404 has a pass band droop that needs to be compensated. To this end, the Nyquist frequency output signal is passed through the decimator 406 to compensate the pass band droop in the output signal. The process of compensating the pass droop in the output signal has been explained in detail in conjunction with FIG. 7.

At step 608, the phase distortion or the phase error in the signal after droop compensation is corrected. The phase error is corrected by passing the signal through an all pass filter. The process of correcting the phase error has already been explained in conjunction with FIG. 5.

Figure 7:
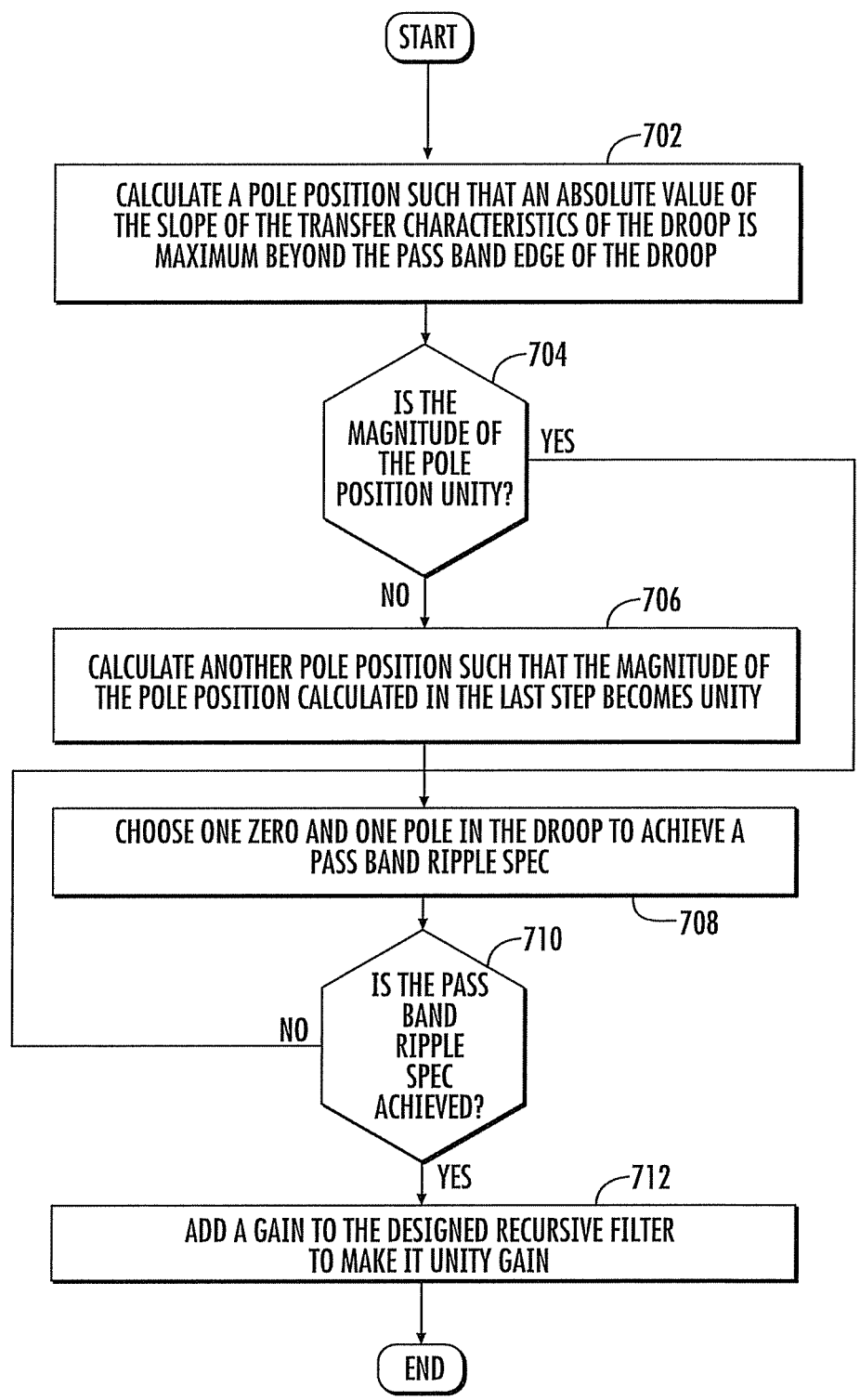
FIG. 7 illustrates a flow diagram for a method for designing a recursive filter, in accordance with an embodiment of the present invention.

FIG. 7 illustrates a flow diagram for a method for designing a recursive filter for compensating a pass band droop, in accordance with an embodiment of the present invention. As already mentioned, a signal output from the decimator 404 needs to be corrected for the pass band droop. To achieve this, the signal is passed through a droop compensator 406, which is made of one or more recursive filters. The present figure describes a method for designing the recursive filter for the droop compensator 406.

Figure 9:
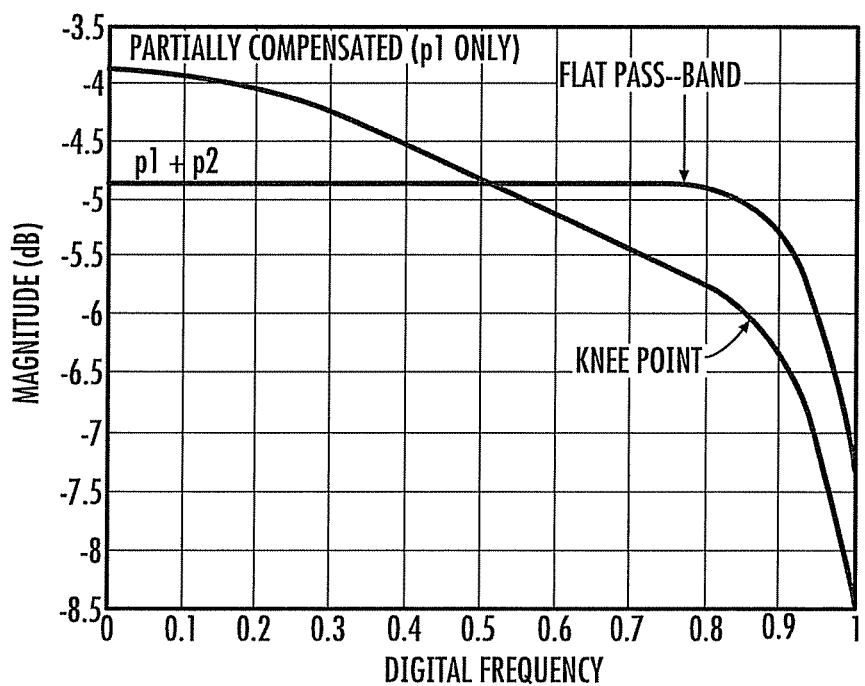
FIG. 9 illustrates a diagram of an exemplary pole position in a droop plot, in accordance with an embodiment of the present invention.

At step 702, a pole position, P1, is calculated for the droop such that the absolute value of the slope of the transfer characteristics of the droop becomes maximum beyond the pass band edge of the droop. The calculated pole position is called the "knee point." The calculated knee point for a droop is shown in FIG. 9. At step 704, it is determined whether the magnitude of the calculated pole position or the knee point is unity. Even if the magnitude of the knee point lies within the pass band ripple specification of unity, the knee point is considered to be at unity.

If, at step 704, it is determined that the magnitude of the knee point is not unity, then at step 706, another pole position, P2, is calculated such the magnitude of the knee point becomes unity. However, if at step 704 it is determined that the magnitude of the knee point is unity, then at step 708, a zero, Z1, and a pole, P3, is chosen to achieve a pass band ripple specification in the droop. The transfer function for the recursive filter thus formed becomes $$\frac{(z - z1)}{(z - p1)(z - p3)}.$$

Figure 8:
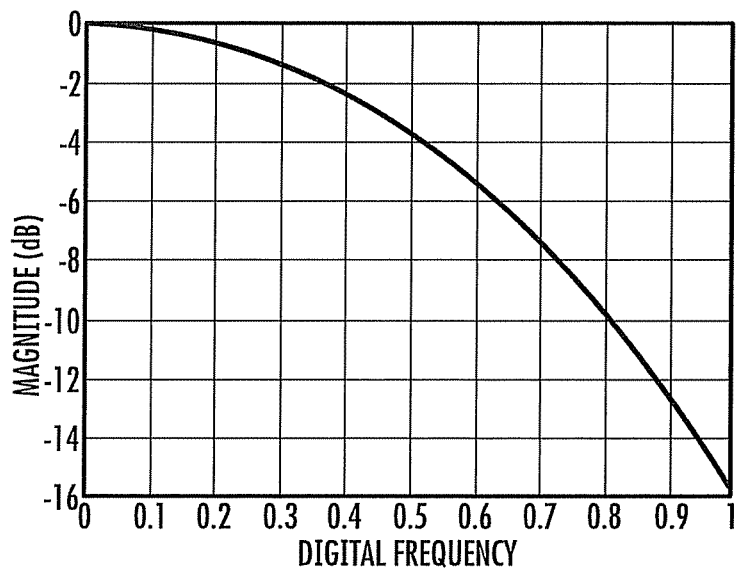
FIG. 8 illustrates a diagram of a pass band droop caused by a single step decimation by the CIC filter, in accordance with an embodiment of the present invention.

Thereafter, at step 710, it is determined whether the pass band ripple specification has been achieved for the droop or not. If the pass band ripple specification is not achieved, then the step of choosing a zero and pole is repeated iteratively till the pass band ripple specification is achieved. After the pass band ripple specification is achieved, the 0 db point in the in-band signal is lowered. To rectify this, at step 712, a gain is added to make the designed recursive filter unity gain FIG. 8 illustrates a diagram of a frequency response showing pass-band droop caused by a single step decimation by the decimator 404, in accordance with an embodiment of the present invention. The decimation in a single step results in the droop in the pass band as illustrated in the frequency response diagram. The frequency response diagram represents values of digital frequency on the horizontal axis and corresponding values of amplitude are represented on the vertical axis. The frequency corresponding to "1" in the diagram is the Nyquist frequency for the high frequency input signal. Further, the pass band corresponds to range of frequencies marked between "0" and "0.8" in the diagram. It can be clearly seen that the amplitude of the output is lowered by ten decibels at frequency corresponding to "0.8."

FIG. 9 is a diagram illustrating the droop compensation of the signal output from the decimator 404. More specifically, this figure illustrates a process of determining pole position or the knee point in the droop, as discussed in conjunction with FIG. 7. In the present figure, a first frequency response 902 is shown for depicting the case when the first pole position, which is depicted as 'knee point', is calculated such that the absolute value of the slope of the transfer characteristics of the droop becomes maximum beyond the pass band edge of the droop. Therefore, the droop characteristic as shown in FIG. 8 becomes modified to as shown in the first frequency response 902.

Since the absolute value of the magnitude of the knee point is not unity in the first frequency response 902, another pole position is calculated, such that the resultant frequency response has a flat pass band. This is shown as a second frequency response 904 in FIG. 9. As is clearly visible, the frequency response is lowered by the introduction of the second pole position, but the resultant frequency response has a flat pass band. To compensate for the lowering of the frequency response, a gain can be added to make the overall gain unity.

Figure 10:
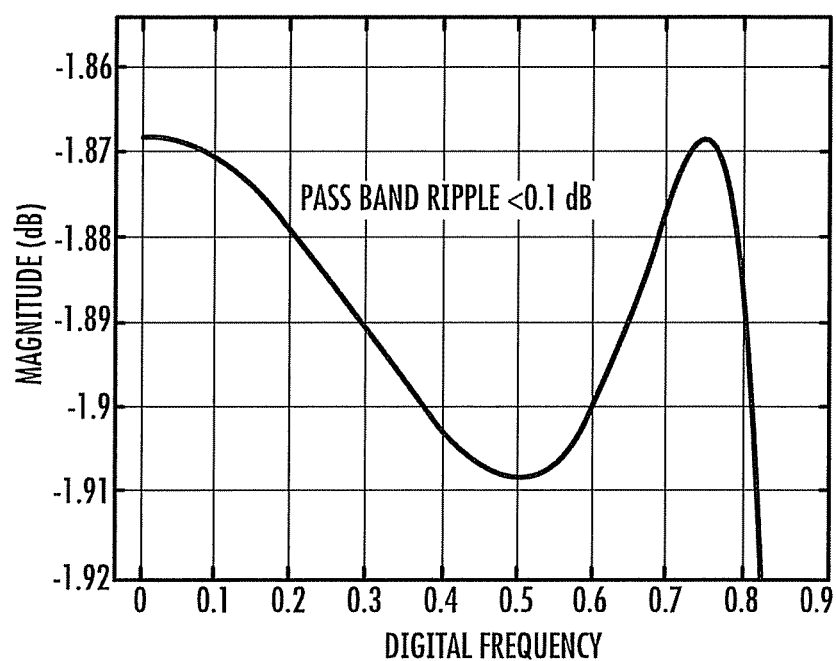
FIG. 10 illustrates a diagram of a pass band ripple as seen in a magnified pass band section, in accordance with an embodiment of the present invention.

FIG. 10 illustrates a diagram of a frequency response showing pass band ripple as seen in a magnified pass band section. The frequency response corresponds to the output from the droop compensator 406. The frequency response diagram represents values of digital frequency on the horizontal axis and corresponding values of amplitude are represented on the vertical axis. The vertical axis is nearly magnified 260 times than the vertical axis of FIG. 8. Pass band ripple is the specification related with the variations in the amplitude of the output signal. Those ordinarily skilled in the art may appreciate that the acceptable pass band ripple specification can be in order of 0.1 db. As evident from the diagram, any fluctuations in amplitude of the output signal from the droop compensator 406 across the complete pass band range corresponding to "0" to "0.8" on horizontal axis are within the 0.1 db range. The output signal from the droop compensator 406 is afflicted with a group delay error introduced by the droop compensator 406. The group delay error caused by the droop compensator 406 is illustrated with the help of FIG. 11.

Figure 11:
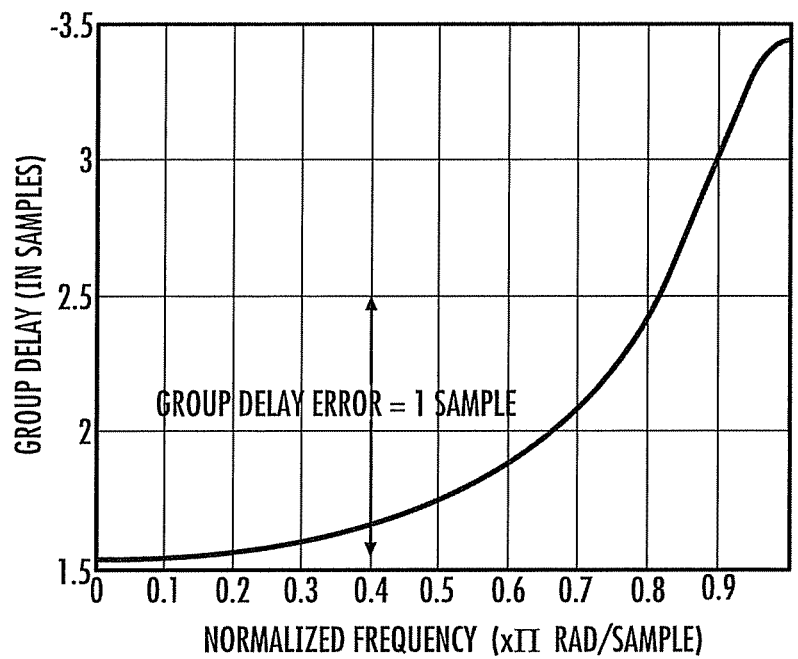
FIG. 11 illustrates a diagram of a group delay error in an output signal from a droop compensator, in accordance with an embodiment of the present invention.

FIG. 11 illustrates a diagram of the group delay error in an output signal from the droop compensator 406. The group delay error is defined as the differentiation of the phase response with respect to the angular frequency and is a measure of phase distortion. As evident from the diagram, a group delay of one sample is introduced over the normalized frequency range of "0" to "0.8," representing the pass band. The group delay error of one sample introduced by the droop compensator 406 is rectified by passing the output signal from the droop compensator 406 through an all pass filter. The all pass filter is implemented in the phase corrector 502 and characteristics of a first order and a second order all pass filter are shown in FIG. 12 and FIG. 13.

Figure 12:
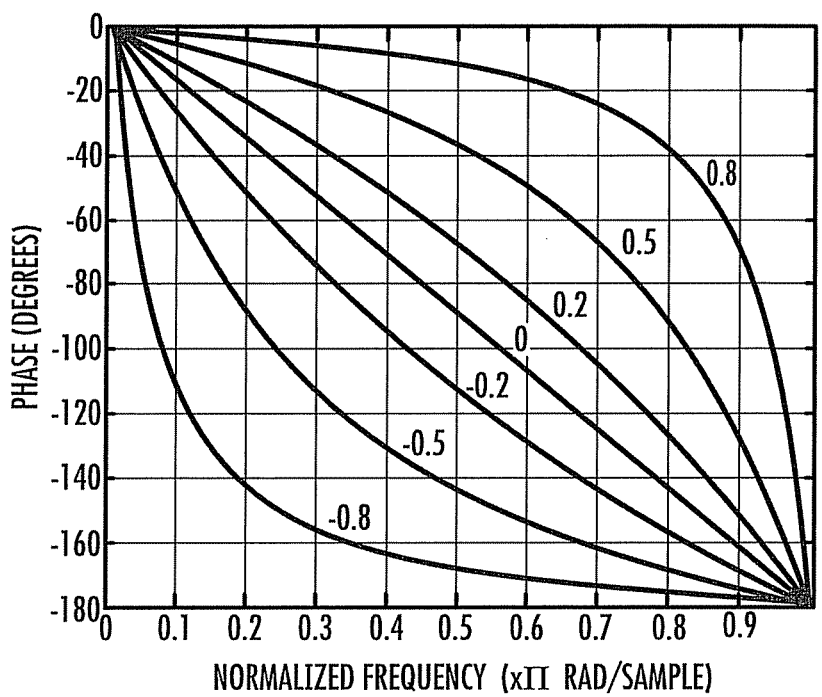
FIG. 12 illustrates a diagram of phase characteristics of a first order all pass section, in accordance with an embodiment of the present invention.

FIG. 12 illustrates a diagram of phase characteristics of a first order all pass filter. An all pass filter is a recursive filter that passes all input frequencies with the unity gain, although the phase of the signal is modified. The first order all pass filter is represented by the transfer equation $$\left[\frac{1 + \alpha_1 \times z^{-1}}{\alpha_1 + z^{-1}}\right].$$

The diagram shows the phase response for the first order all pass filter. Phase response of a similar all pass filter but of second order filter can be seen in FIG. 13.

Figure 13:
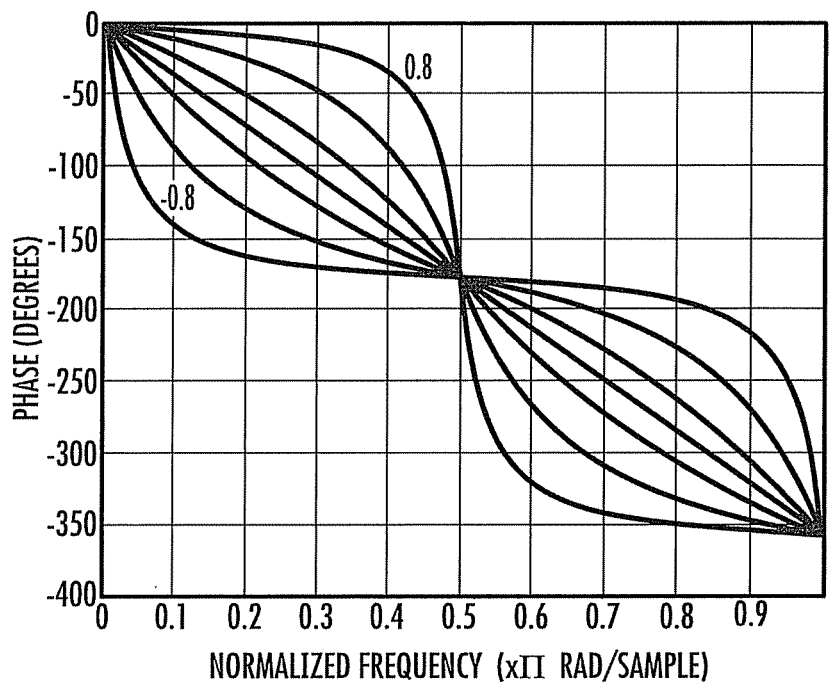
FIG. 13 illustrates a diagram of phase characteristics of a second order all pass section, in accordance with an embodiment of the present invention.

FIG. 13 illustrates a diagram of phase characteristics of a second order all pass filter. The second order all pass filter is represented by the transfer equation $$\left[\frac{1 + \alpha_2 \times z^{-1}}{\alpha_2 + z^{-1}}\right]^\wedge 2.$$

The diagram shows the phase response for the second order all pass filter. All pass filters of higher order can also be designed that can be used to achieve a linear phase response in the pass band without changing the magnitude of the frequency response. Sample delay in the output from the droop compensator 406 can be reduced by using a combination of the first order all pass filter and the second order all pass filter as explained in conjunction with FIG. 14.

Figure 14:
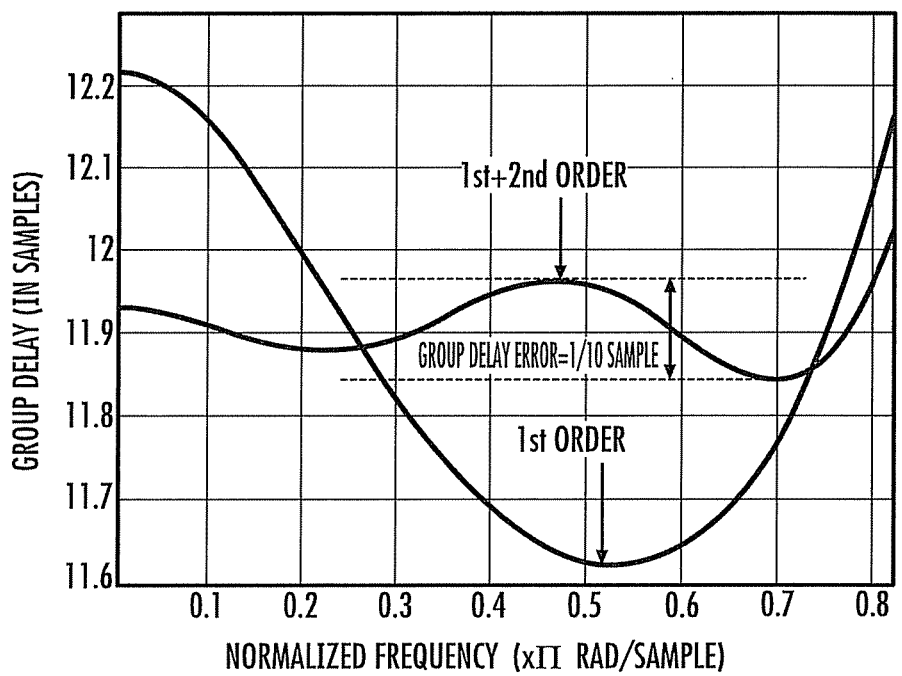
FIG. 14 illustrates a diagram of the group delay error corrected by a combination of first and second order all pass sections, in accordance with an embodiment of the present invention.

FIG. 14 illustrates a diagram of the group delay error corrected by a combination of first and second order all-pass filters. The output signal from the droop compensator 406 is passed through the first order all pass filter in the phase corrector 502 to get a group delay that is nearly 0.6 samples. This group delay can be further reduced by combining the second order all pass filter with the phase corrector 502. On combining both the first order all pass filter and the second order all pass filter, the group delay is reduced to 0.1 samples over the complete pass band. Hence the output signal from the droop compensator 406 is now within the acceptable limits.

It may be appreciated that embodiments of the invention described herein may be comprised one or more conventional processors and unique stored program instructions that control the one or more processors to implement, in conjunction with certain non-processor circuits, some, most, or all of the functions of the embodiments of the invention described herein. The non processor circuits may include, but are not limited to, signal drivers, clock circuits, power source circuits, and user input devices. As such, these functions may be interpreted as steps of a method of using a filter block for compensating pass band droop in a signal. Alternatively, some or all functions could be implemented by a state machine that has no stored program instructions, or in one or more application specific integrated circuits (ASICs), in which each function or some combinations of certain of the functions are implemented as custom logic. Of course a combination of these approaches could be used. Thus, methods and means for these functions have been described herein. In those situations for which functions of the embodiments of the invention can be implemented using a, processor and stored program instructions, it may be appreciated that one means for implementing such functions is the media that stores the stored program instructions, be it magnetic storage or a signal conveying a file. Further, it is expected that one of ordinary skill, notwithstanding possibly significant effort and many design choices motivated by, for example, available time, current technology, and economic considerations, when guided by the concepts and principles disclosed herein may be readily capable of generating such stored program instructions and ICs with minimal experimentation.

In the foregoing specification, the invention and its benefits and advantages have been described with reference to specific embodiments. However, one with ordinary skill in the art would appreciate that various modifications and changes can be made, without departing from the scope of the present invention, as set forth in the claims below. Accordingly, the specification and the figures are to be regarded in an illustrative rather than a restrictive sense, and all such modifications are intended to be included within the scope of the present invention. The benefits, advantages, approaches to problems, and any element(s) that may cause any benefit, advantage or approach to occur or become more pronounced are not to be construed as critical, required or essential features or elements of any or all the claims. The invention is defined solely by the appended claims, including any amendments made during the pendency of this application, and all equivalents of those claims, as issued.

The Abstract of the Disclosure is provided to comply with 37 C.F.R. §1.72(b), requiring an abstract that may allow the reader to quickly ascertain the nature of the technical disclosure. It is submitted with the understanding that it may not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features in each claim. Rather, as the following claims reflect, inventive subject matter lies in less than all features of a single disclosed embodiment. Thus the following claims are hereby incorporated into the Detailed Description, with each claim standing, on its own as a separately claimed subject matter.

That which is claimed:

1. A filter block comprising:
a decimator configured to decimate an input signal to an output signal having a set frequency; and
a droop compensator configured to compensate for pass band droop in the output signal from said decimator and comprising at least one recursive filter.

2. The filter block according to claim 1 wherein said decimator is configured to decimate the input signal into the output signal with set frequency in a single step.

3. The filter block according to claim 1 wherein said decimator comprises a Cascaded Integrator-Comb (CIC) filter.

4. The filter block according to claim 1 further comprising an all pass filter section downstream from said droop compensator.

5. The filter block according to claim 4 wherein said all pass filter section is configured to correct a phase distortion from an output of said droop compensator.

6. The filter block according to claim 4 wherein said droop compensator is cascaded with said all pass filter section.

7. The filter block according to claim 1 wherein said droop compensator comprises at least one finite impulse response (FIR) filter.

8. The filter block according to claim 1 wherein the set frequency comprises a Nyquist frequency of the input signal.

9. A filter block comprising:
a decimator configured to decimate an input signal to an output signal having a set frequency;
a droop compensator configured to compensate for pass band droop in the output signal from said decimator and comprising a plurality of low order recursive filters; and
an all pass filter section downstream from said droop compensator and configured to correct a phase distortion from an output from said droop compensator.

10. The filter block according to claim 9 wherein said decimator is configured to decimate the input signal into the output signal with the set frequency in a single step.

11. The filter block according to claim 9 wherein said decimator comprises a Cascaded Integrator-Comb (CIC) filter.

12. The filter block according to claim 9 wherein said droop compensator is cascaded with said all pass filter section.

13. The filter block according to claim 9 wherein said droop compensator comprises at least one finite impulse response (FIR) filter.

14. The filter block according to claim 9 wherein the set frequency comprises a Nyquist frequency of the input signal.

15. A method implemented by a filter block to compensate for pass band droop in a filtered signal, the method comprising:
decimating an input signal to an output signal having a set frequency; and
compensating for the pass band droop in the decimated output signal using a recursive filter.

16. The method according to claim 15 wherein the input signal is decimated into the output signal with the set frequency in a single step.

17. The method according to claim 15 further comprising correcting a phase distortion in an output of the recursive filter.

18. The method according to claim 15 wherein compensating for the pass band droop comprises calculating a first pole position; and wherein the first pole position is calculated so that an absolute value of a slope of transfer characteristics of the pass band droop is maximum beyond a pass band edge of the pass band droop.

19. The method according to claim 18 further comprising determining whether a magnitude of the calculated pole position is unity.

20. The method according to claim 19 further comprising calculating a second pole position; and wherein the second pole position is calculated so that the magnitude of the first pole position becomes unity.

21. The method according to claim 18 further comprising choosing a first zero and a first pole for maintaining a set pass band ripple threshold.

22. The method according to claim 21 further comprising determining whether the pass band ripple threshold has been achieved.

23. The method according to claim 22 further comprising choosing a second zero and a second pole to achieve the pass band ripple threshold.

24. The method according to claim 23 further comprising adjusting a gain value of an all pass filter for providing an overall gain of unity.

* * * * *